United States Patent
Gunderson et al.

(10) Patent No.: US 6,931,607 B2
(45) Date of Patent: Aug. 16, 2005

(54) SYSTEM AND METHOD FOR DESIGNING CIRCUITS IN A SOI PROCESS

(75) Inventors: Jason R. Gunderson, Fort Collins, CO (US); Jonathan E. Lachman, Fort Collins, CO (US); Robert McFarland, Murphy, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 78 days.

(21) Appl. No.: 10/282,342

(22) Filed: Oct. 29, 2002

(65) Prior Publication Data

US 2004/0083435 A1 Apr. 29, 2004

(51) Int. Cl.[7] ..................... G06F 17/50; H03K 19/00
(52) U.S. Cl. ..................... 716/4; 716/1; 326/95
(58) Field of Search .................. 716/1, 4–6, 2; 703/13–15; 326/21, 23, 27, 28, 31–34, 93, 95, 98

(56) References Cited

U.S. PATENT DOCUMENTS

| | | | |
|---|---|---|---|
| 5,995,425 A | 11/1999 | Henkels et al. | 365/201 |
| 6,028,983 A | 2/2000 | Jaber | 714/30 |
| 6,072,947 A | 6/2000 | Roychowdhury et al. | 703/14 |
| 6,111,422 A | 8/2000 | Storino et al. | 324/763 |
| 6,163,173 A | 12/2000 | Storino et al. | 326/98 |
| 6,189,133 B1 | 2/2001 | Durham et al. | 716/17 |
| 6,288,572 B1 | 9/2001 | Nowka | 326/98 |
| 6,300,819 B1 | 10/2001 | De et al. | 327/534 |
| 6,326,814 B1 | 12/2001 | Stasiak et al. | 326/98 |
| 6,378,112 B1 | 4/2002 | Martin et al. | 716/5 |
| 6,396,305 B1 | 5/2002 | Carlson | 326/98 |
| 6,492,838 B2 * | 12/2002 | Coppin et al. | 326/95 |
| 2002/0175711 A1 * | 11/2002 | Gunderson | 326/98 |

OTHER PUBLICATIONS

U.S. Appl. No. 10/282,478, filed Oct. 29, 2002, Lachman.

* cited by examiner

*Primary Examiner*—Leigh M. Garbowski

(57) ABSTRACT

A system and method is disclosed for designing a dynamic circuit in a silicon-on-insulator (SOI) process comprising the steps of representing the dynamic circuit using at least one logic circuit, wherein the at least one logic circuit is selected from a group consisting of: an OR circuit with a DNG field effect transistor (FET), an OR circuit, and an AND circuit, and wherein the at least one logic circuit is selected according to body voltage characteristics of each circuit in the group.

12 Claims, 6 Drawing Sheets

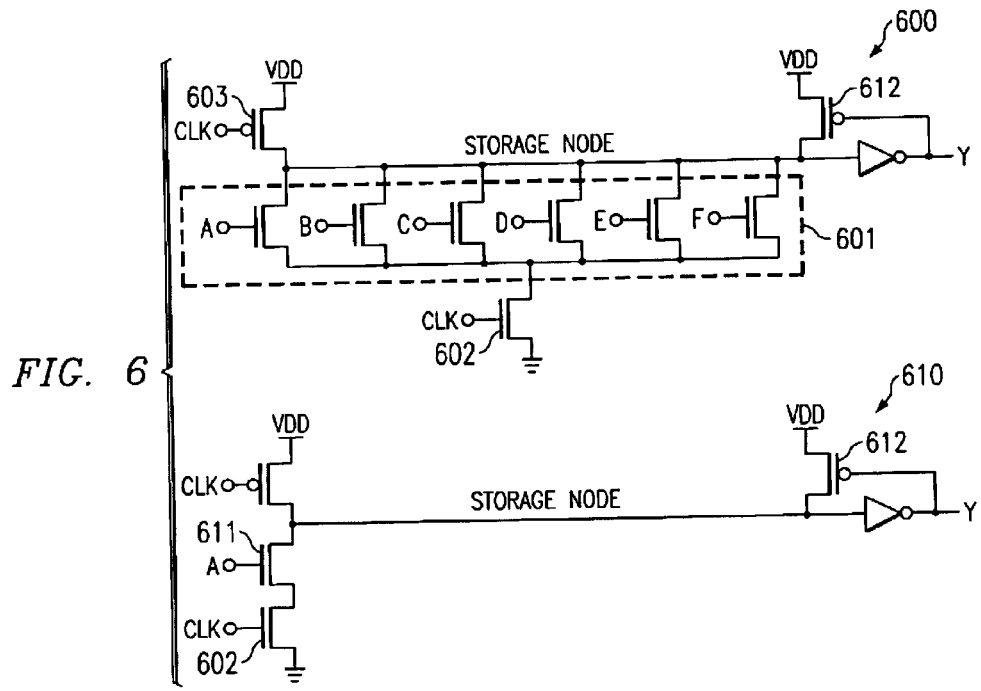
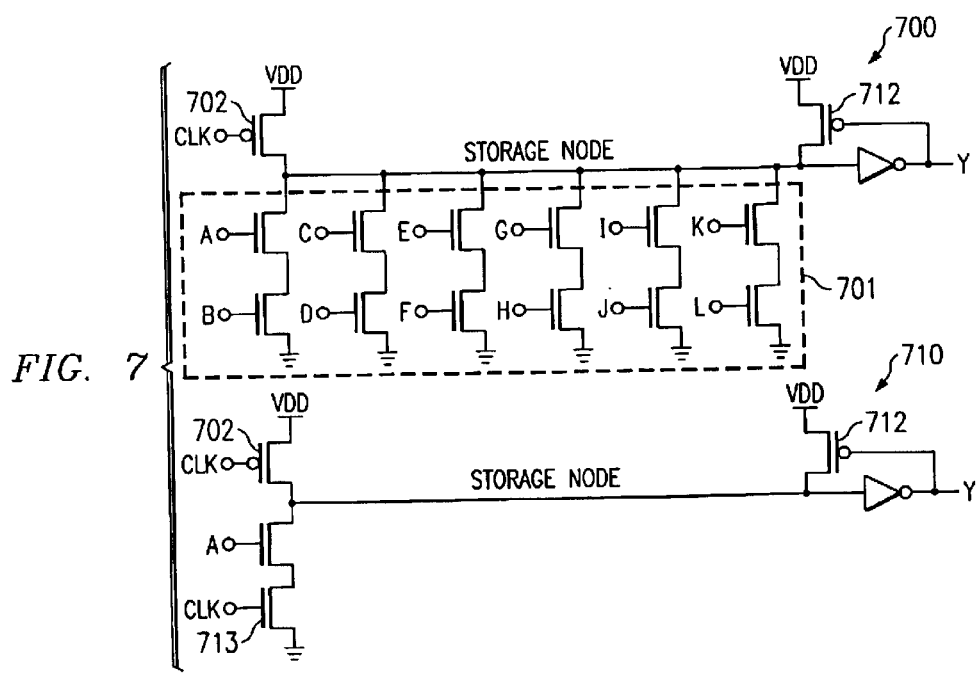
FIG. 6
FIG. 7

SYSTEM AND METHOD FOR DESIGNING CIRCUITS IN A SOI PROCESS

RELATED APPLICATIONS

This application is related to concurrently filed and commonly assigned U.S. patent application Ser. No. 10/282,478 entitled "PROCESS AND SYSTEM FOR DEVELOPING DYNAMIC CIRCUIT GUIDELINES", the disclosure of which is hereby incorporated herein by reference.

FIELD OF THE INVENTION

The present invention is directed to designing dynamic circuits and, more specifically, to a system and method for representing all silicon-on-insulator (SOI)-based dynamic circuits via a combination of, at most, three logic circuits.

BACKGROUND

Dynamic circuits are circuits designed for high speed logic gates. The intent for such circuits is typically to achieve the fastest switching speed available with the lowest possible power consumption. Dynamic circuits have been implemented in bulk complementary metal-oxide semiconductor (CMOS) in order to take advantage of the speed and power benefits of CMOS. Recent advances in integrated circuit technology have shown the speed and power advantages of SOI-based integrated circuits. FIG. 1A is a cross-section view of CMOS device 100. P-type body/substrate 101 includes two n-type wells, source 102 and drain 103. Gate terminal 104, along with source 102 and drain 103 form the CMOS field effect transistor (CMOSFET). In operation, a large capacitance typically forms between source 102 and body/substrate 101 and between drain 103 and body/substrate 101. This capacitance not only delays the switching speed, but also contributes to added power consumption.

FIG. 1B is a cross-section view of SOI device 105. SOI device 105 includes n-type source 109, gate terminal 111, p-type substrate 106, and n-type drain 110. However, unlike bulk CMOS device 100, oxide layer 107 isolates source 109 and drain 110 from body 108. Because the source-to-body and drain-to-body junctions are isolated, there is not as much junction capacitance formed in SOI device 105 as in CMOS device 100. As a result, SOI-based designs are approximately 30% faster than CMOS designs, with a typical 80% reduction in power consumption.

The isolation of the junctions in SOI-based devices results in a body voltage that may float depending on the configuration of the circuit in which the device is included. In comparison, the body voltage in bulk CMOS devices remains more or less constant. The floating body effect in SOI-based technology, therefore, creates problems in the design of dynamic circuits.

BRIEF SUMMARY OF THE INVENTION

The present invention is directed to a system and method for designing a dynamic circuit in a silicon-on-insulator (SOI) process comprising the steps of representing the dynamic circuit using at least one logic circuit, wherein the at least one logic circuit is selected from a group consisting of: an OR circuit with a DNG field effect transistor (FET), an OR circuit without said DNG FET, and an AND circuit, and wherein the at least one logic circuit is selected according to body voltage characteristics of each circuit in the group.

BRIEF DESCRIPTION OF THE DRAWINGS

FIG. 6 is a circuit schematic illustrating a wide gate width OR circuit with a DNG FET and one possible corresponding model circuit generated according to one embodiment of the present invention;
FIG. 7 is a circuit schematic illustrating a wide gate width OR circuit with a DNG FET and one possible corresponding model circuit generated according to one embodiment of the present invention.

DETAILED DESCRIPTION OF THE INVENTION

Figure 2:
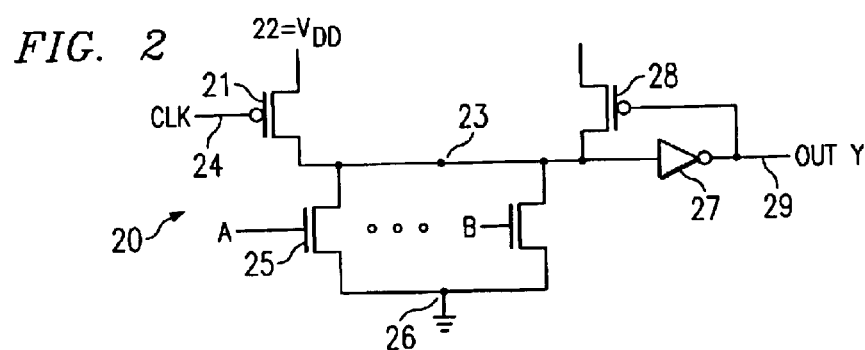
FIG. 2 is a circuit diagram representation of an OR logic circuit as used in accordance with an embodiment of the present invention.

Dynamic circuits typically are constructed with similar basic parts. FIG. 2 is a circuit diagram representation of an OR logic circuit in accordance with an embodiment of the present invention. While FIG. 2 shows one of the circuits used in design methodologies implemented according to the teachings of the present invention, it is also configured as a simple dynamic circuit. OR circuit 20 may comprise one FET positioned to assist in charging storage node 23 to the appropriate/desired charge/value. This FET is generally referred to as "pre-charge" FET 21. Another typical feature of a dynamic circuit, such as OR circuit 20, is another FET positioned to hold the storage node 23 at the desired charge/value. This FET is generally referred to as "holder" FET 28 and may be either a p- or n-type FET (typically a p-type, PFET) depending on the configuration of the overall circuit technology. Because of their typical configuration, pre-charge FET 21 will generally be the same type (p- or n-) as holder FET 28.

A dynamic circuit, such as OR circuit 20, may also generally include another FET positioned to provide a path to ground for storage node 23 during evaluation of the circuit (i.e., when the circuit content/charge is read). This FET is generally referred to as "pull-down" FET 25. Because its function usually causes it to sink or pass considerable current, pull-down FET 25 is generally a strong, robust transistor. Furthermore, there may be multiple FETs making up the function of pull-down FET 25. It should be further noted that, depending on the configuration of the circuit, the holder and pre-charge FETs could be NFETs with the pull-down FET being PFET. A dynamic circuit, such as OR circuit 20, may also have a forward inverter, such as inverter 27, which inverts the value/charge on storage node 23, for output 29.

Many dynamic circuits are clock-driven circuits, meaning that their cycles are triggered by clock pulses. There are typically two clock phases for dynamic circuits: pre-charge phase and evaluation phase. The pre-charge phase generally occurs when pull-down FET 25 is turned off and pre-charge FET 21 is on. During this phase, pre-charge FET 21 will typically charge storage node 23. The evaluation phase generally occurs when clock 24 is in a second state, such as the high state. During the evaluation phase, pull-down FET 25 will be on when OR circuit 20 is to be evaluated. This allows pull-down FET 25 to provide a path to ground; thereby, allowing OR circuit 20 to be evaluated. Depending on what OR circuit 20 is evaluating, pull-down FET 25 may either turn on and discharge storage node 23, or remain off in which case storage node 23 should maintain its charge with the help of holder FET 28. Holder FET 28 is typically designed to be weak so that during the evaluation phase pull-down FET 25 will be stronger than holder FET 28; thus, storage node 23 will be discharged and OR circuit 20 evaluated.

Complexity typically arises during the pre-charge phase when precharge FET 21 is off and storage node 23 is being held at charge. In this situation, a problem sometimes arises when noise is present on pull-down FET 25. Even though a FET will typically not turn on until a threshoid voltage is reached, current may still leak through the device (referred to as sub-threshold leakage) if voltage on the gate terminal increases. The noise may supply enough voltage to the gate terminal to increase the amount of sub-threshold leakage, which may lead to incorrectly evaluating the circuit.

Figure 1A:
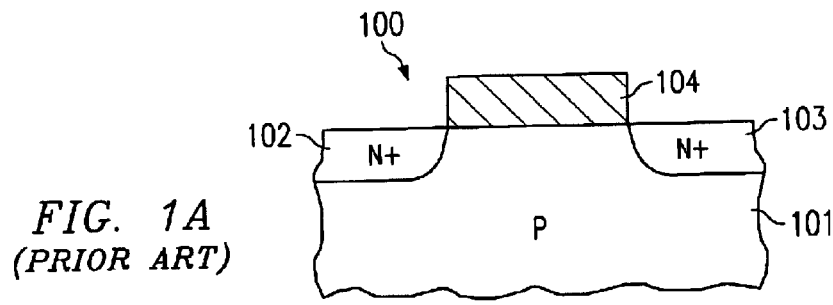
FIG. 1A is a cross-section view of a CMOS device.
Figure 1B:
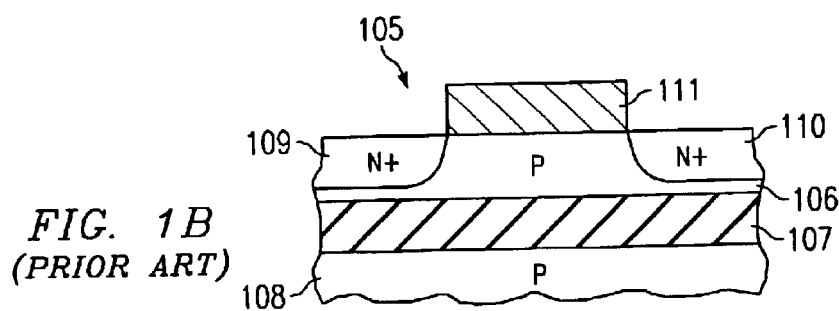
FIG. 1B is a cross-section view of a SOI device.

Another source of leakage in SOI devices comes from the parasitic bipolar junction transistor (BJT) that may form in an NFET. Referring again to FIG. 1B, an NFET generally comprises n-type source 109 (emitter), p-type body 108 (base), and n-type drain 110 (collector). Under the right conditions, this configuration may activate the BJT and begin BJT leakage current leaking through the SOI device. This may occur when source 109 voltage drops below the body voltage (i.e., forward biasing the base-emitter junction). Because source 102 (FIG. 1A) is typically tied to substrate 101 (FIG. 1A) in bulk CMOS, parasitic BJT leakage, while still there, usually does not create a problem.

To minimize the sub-threshold and BJT leakage, the circuit's immunity to noise generally needs to be increased. One way to increase a circuit's noise immunity is to increase the size of holder FET 28. Increasing holder FET 28's size generally makes it more difficult for pull-down FET 25 to turn on; thus, making it more difficult for noise across pull-down FET 25 to inadvertently turn them on. However, by increasing the size of holder FET 28, it also typically becomes more difficult to evaluate OR circuit 20 when desired. This difficulty generally arises because holder FET 28 and pull-down FET 25 will likely compete between pulling-down or maintaining the storage node charge. Consequently, to evaluate OR circuit 20, the size of pull-down FET 25 will usually need to be larger than the size of holder FET 28.

Another method for increasing the circuit's noise immunity would be to change the forward inverter ratio (FIR). The FIR is generally considered to be the ratio between the FETs of a circuit's forward inverter, such as forward inverter 27. The higher the FIR ratio, the faster the transistors will typically switch, whereas the lower the ratio, the slower the transistors will likely switch. The objective in designing SOI dynamic circuits then is to find the optimal ratio, where the circuit is as fast as possible while remaining immune to noise.

In the design and modeling of CMOS dynamic circuits, a single-circuit model is typically used to represent and/or model the worst-case scenarios of all dynamic circuits. OR circuit 20, shown in FIG. 2, is generally the single model circuit used to model the "worst-case" design in CMOS. Designer's typically design for worst-case in order to create robust circuits capable of operation in the worst-case. In CMOS technology, a single-circuit model is adequate to model any circuit architecture because the bodies are coupled to the substrate and, thus, essentially connected to ground. However, in SOI technology single-circuit-type modeling is inadequate due to the existence of the "floating body." Consequently, the body voltage may change, both dynamically and statically, making it impractical to model SOI dynamic circuits with only a single-circuit because the body voltage may range (i.e., "float") anywhere from 0 to $V_{DD}$. Furthermore, using only a single circuit-model, while producing a robust circuit, would generally sacrifice considerable performance in certain circuit configurations. As a result, each SOI-based dynamic circuit is generally modeled individually. This modeling process can be extremely time consuming and, therefore, expensive to implement. For complex circuits, many man-hours of engineer time may be expended.

Referring again to FIG. 2, FIG. 2 is a circuit diagram representation of OR circuit 20 as used in accordance with an embodiment of the present invention. OR circuit 20 includes a clock-based precharge p-type field effect transistor (precharge PFET 21), wherein its gate is connected to input clock 24, its source terminal is connected to voltage source, $V_{DD}$ 22, and its drain terminal is connected to storage node 23. OR circuit 20 also includes a pull-down n-type field effect transistor(s) (pulldown NFET 25), which generally comprises one or more NFETs in parallel with one another, wherein the drain terminals are connected to storage node 23.

Dynamic circuits usually have two processing phases: the precharge phase and the evaluation phase. These processing phases may be emulated via OR circuit 20 in FIG. 2. The precharge phase of OR circuit 20 occurs when input clock 24 is in a low state, i.e., precharge PFET 21 is turned on, which in turn charges storage node 23. Holder PFET 28 assists in maintaining the charge of storage node 23. The evaluation phase occurs when input clock 24 is in a high state and precharge PFET 21 is turned off. Although it is not necessary, pull-down NFET 25 may be turned on during the evaluation phase. When on, pull-down NFET 25 provides a path for the charge stored in storage node 23 to be pulled down to ground 26.

Forward inverter 27 drives the correct logic value of holder PFET 28 gate to the rest of the circuitry via output 29. Forward inverter 27 will output the opposite value of storage node 23. For example, if storage node 23 is a 1, the inverter will put a 0 onto the gate of holder PFET 28; thereby, turning it on and helping maintain the charge on storage node 23. As storage node 23 goes to 0, the input to forward inverter 27 is switched to 0; thereby causing its output to change from 0 to 1. This also causes the value at holder PFET 28 gate to be 1. As a result, the holder PFET 28 is turned off, allowing the storage node 23 to go completely to 0.

Figure 3:
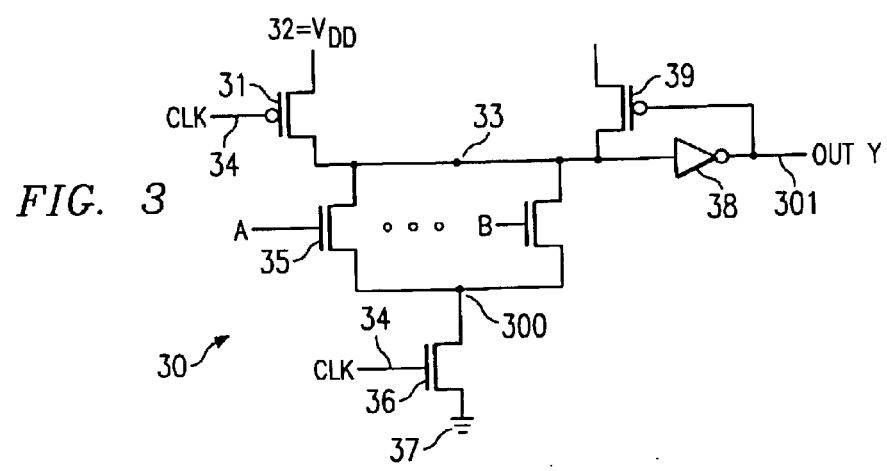
FIG. 3 is a circuit diagram representation of an OR logic circuit with a DNG FET as used in accordance with an embodiment of the present invention.

FIG. 3 is a circuit diagram representation of an OR logic circuit with a DNG FET in accordance with an embodiment of the present invention. The DNG FET, also referred to as a clock FET or foot FET, is typically an n-channel device at the bottom of the pull-down tree whose gate is connected to a precharge clock (CLK 34), preventing a stack or row of FETs with static inputs from pulling down during the precharge phase. DNG is ground (GND) spelled backwards. Similar to OR circuit 20 depicted in FIG. 2, DNG-OR circuit 30 includes clock-based precharge PFET 31, voltage source 32, storage node 33, one or more pull-down NFET(s) (pull-down NFET 35), forward inverter 38, and holder PFET 39. However, unlike OR circuit 20 of FIG. 2, DNG-OR circuit 30 contains DNG FET 36, which is shown in FIG. 3 as an NFET transistor, wherein the gate terminal is connected to clock 34 and the source is connected to ground 37. OR circuit 20 generally has more noise immunity than DNG-OR circuit 30 primarily because the body of pull-down NFET 35 is allowed to "float" up to $V_{DD}$.

The precharge and evaluation phases of DNG-OR circuit 30 are activated similar to OR circuit 20 of FIG. 2. When input clock 34 is low, precharge PFET 31 is turned on and storage node 33 is charged to $V_{DD}$, with the help of holder PFET 39. DNG-FET 36 is off during the precharge phase. The evaluation phase occurs when input clock 34 goes high. In this instant, the high clock state turns off precharge PFET 31 and may cause the DNG-FET 36 to bring storage node 33 to ground 37 depending on the gate voltage of the pull-down FET(s).

During the precharge phase, pull-down NFET 35 are typically in a low state. However, if pull-down NFET 35 is in a high state for some reason, such as if the transistor makes a late transition in a cycle, it could cause that NFET to remain on during a portion of the precharge phase. Because the NFET is turned on while storage node 33 is at $V_{DD}$, the value at interstitial node (INT) 300 is $V_{DD}$ minus some threshold voltage, $V_T$. In this instant, there are diodes between the body and the drain terminal, and the body and the source terminal of pull-down NFET 35. These diodes are created in pull-down NFET 35 because the body is a p-type material (body 108 of FIG. 1B) and the drain and the source terminals are n-type (source 109 and drain 110 of FIG. 1B). Consequently, there is a pn-junction between each of the two (i.e., the body and the drain, and the body and the source.) This creates a reverse-biased diode causing charge to leak on the body. This also triggers the body voltage to "float" high because there is a charge coming from both the source and the drain of the NFET(s) through the body.

Both the OR circuit without DNG FET and the OR circuit with DNG FET logic circuits function as OR gates. When pull-down NFET 25 and 35 switch on, the current will pass through the pull-down NFET 25 and 35 to ground. Accordingly, the output will be in the high state. However, if pull-down NFET 25 and 35 are off, in this instance there is no connection to ground 26 and 37 and this portion of the circuit is off. As storage nodes 23 and 33 transition to the low state, outputs 29 and 301 of the circuit will be high. In contrast, when storage nodes 23 and 33 transition to the high state, outputs 29 and 301 will be low. Such functioning of pull-down NFET 25 and 35 act like an OR logic gate, wherein outputs, Y, 29 and 301 are of the value where $Y=A+B$.

Figure 4:
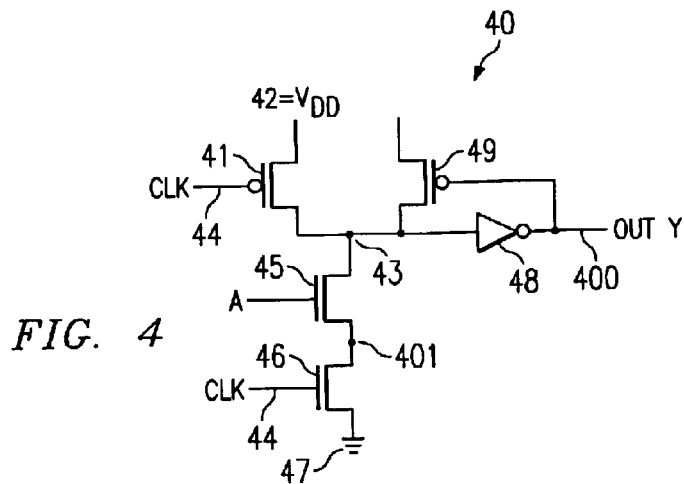
FIG. 4 is a circuit diagram representation of an AND logic circuit as used in accordance with an embodiment of the present invention.

FIG. 4 is a circuit diagram representation of an AND logic circuit in accordance with an embodiment of the present invention. AND circuit 40 of FIG. 4 is similar to DNG-OR circuit 30 of FIG. 3. As in FIGS. 1 and 2, AND circuit 40 contains clock-based precharge PFET 42, clock-based DNG FET 46, holder PFET 49, pull-down NFET 45, storage node 43, and inverter 48. In one embodiment of the present invention, AND logic circuit has a precharge phase and an evaluation phase. As in FIGS. 2 and 3, the pre-charge phase begins when input clock 44 is in the low state. This turns on precharge PFET 42 and turns off pull-down NFET 45. Holder PFET 49 assists in maintaining the charge of storage node 43. Further, holder PFET 49 may assist in charging storage node 43 when forward inverter 48 switches to output logic value 1. The evaluation phase of AND circuit 40 occurs when input clock 44 is in the high state; thereby, turning off precharge PFET 42 and holder PFETs 49. This turns on pull-down NFET 45, which, in turn, might deplete the voltage in storage node 43 and bring its value to ground.

AND logic circuit 40 functions as an AND logic gate, wherein output 400, Y, is of the value where $Y=A \cdot CLK$. Both pull-down NFET(s) 45 and DNG FET 46 are typically in the high state to allow the circuit to be evaluated. Accordingly, if either NFET 45 or DNG FET 46 are in the low state, the current will not pass to ground 47, and the circuit will not be evaluated. It should be noted that in additional embodiments, instead of having DNG FET 46, AND logic circuit 40 may have an additional variable input node, such as B, where $Y=A \cdot B$.

OR circuit 20, DNG-OR circuit 30, and AND circuit 40 of the present invention are preferably the optimal subset of logic circuits used to represent all dynamic circuit types.

The OR circuit 20 is preferably used to represent wide gate-width OR circuits that have a single pull-down FET. When the widths of the individual pull down FETs are added together, an equivalent width for a single pull-down FET is obtained. In an embodiment of the present invention, the cumulative width of the pull-down FET(s) is then used to reference a table and obtain the corresponding holder FET width and FIR. As the sources of all pull-down FETs are tied directly to ground, the body of the pull-down FET(s) typically does not equal more than 0.5 V. Consequently, there will be less leakage current.

Each of OR circuit 20, DNG-OR circuit 30, and AND circuit 40 of the present invention has individual body voltage variations. Consequently, when OR circuit 20, DNG-OR circuit 30, and/or AND circuit 40 are combined together to form a simulation circuit, the logic circuits adequately model the dynamic and static body voltage variations of a SOI-based dynamic circuit. The body voltage in OR circuit 30 (FIG. 3) reaches the highest body voltage, AND circuit 40 (FIG. 4) has the second highest, while DNG-OR circuit 20 (FIG. 2) achieves the lowest body voltage. As each logic circuit results in a different body voltage, the optimal dynamic circuit simulation can be achieved via a combination of the various OR circuit 20, DNG-OR circuit 30, and AND circuit 40 of the present invention.

In OR circuit 20, shown in FIG. 2, the body voltage is determined by the diodes existing between the body and drain terminal as well as the body and source terminal. The diode between the body and drain terminal is typically reversed biased. However, if the body ever gets above 0.5 V the diode between the body and source terminal is typically forward biased. As a result, the body-drain diode might raise the voltage of the body, yet, the body-source diode usually prevents it from exceeding 0.5V.

In AND logic circuit 40, depicted in FIG. 4, the body voltage is determined, at least in part, by the body-drain and body-source diodes as in OR circuit 20. If the top pull-down NFET 45 were left on (i.e. the FET made a late transition), INT node 401 would be allowed to charge up to $V_{DD}$ minus $V_T$, resulting in generally no forward biased diode compressing the body voltage, and dumping charge onto the body; thus, allowing the body voltage to float near $V_{DD}$. In this situation, before the circuit can be evaluated, the pull-down NFET(s) would typically need to make a low transition. As a result of pull-down NFET(s) making this low transition, the capacitive effect causes the body voltage to fall. Moreover, capacitance exists between the gate and the source, the gate and the body, and the source and the body.

As the input (gate voltage) is lowered, the source voltage is also lowered, lowering the body voltage as well. Because this process generally causes the source voltage to be less than the body voltage, the combination of the n-type source, the p-type body, and the n-type drain form an n-p-n BJT, in which the body becomes the base of the BJT. With the body (base) voltage higher than the source (emitter) voltage, some parasitic BJT current leakage is observed from the storage node, as well as sub-threshold voltage resulting in a degradation of the storage node.

DNG-OR circuit 30, depicted in FIG. 3, has the highest body voltage. In DNG-OR circuit 30, the body voltage is determined by the diodes as in OR circuit 20 and AND circuit 40. However, just as in AND circuit 40, if pull-down NFET 35 were left on (i.e. the FET made a late transition), INT node 300 would be allowed to charge up to VDD minus VT, resulting in generally no forward biased diode compressing the body voltage, and dumping charge onto the body; thus, allowing the body voltage to float near $V_{DD}$. However, DNG-OR circuit 30 differs from AND circuit 40, as the sources of all pull-down NFETs are connected (i.e. pull-down NFETs in parallel), wherein the common node is INT node 300. This configuration typically results in a large amount of capacitance on INT node 300; even larger capacitance than typically associated with the AND logic circuits. With this capacitance, as the gate makes a transition, it encounters a much more difficult time effecting/moving the source voltage (i.e., the voltage at INT node 300).

Figure 5:
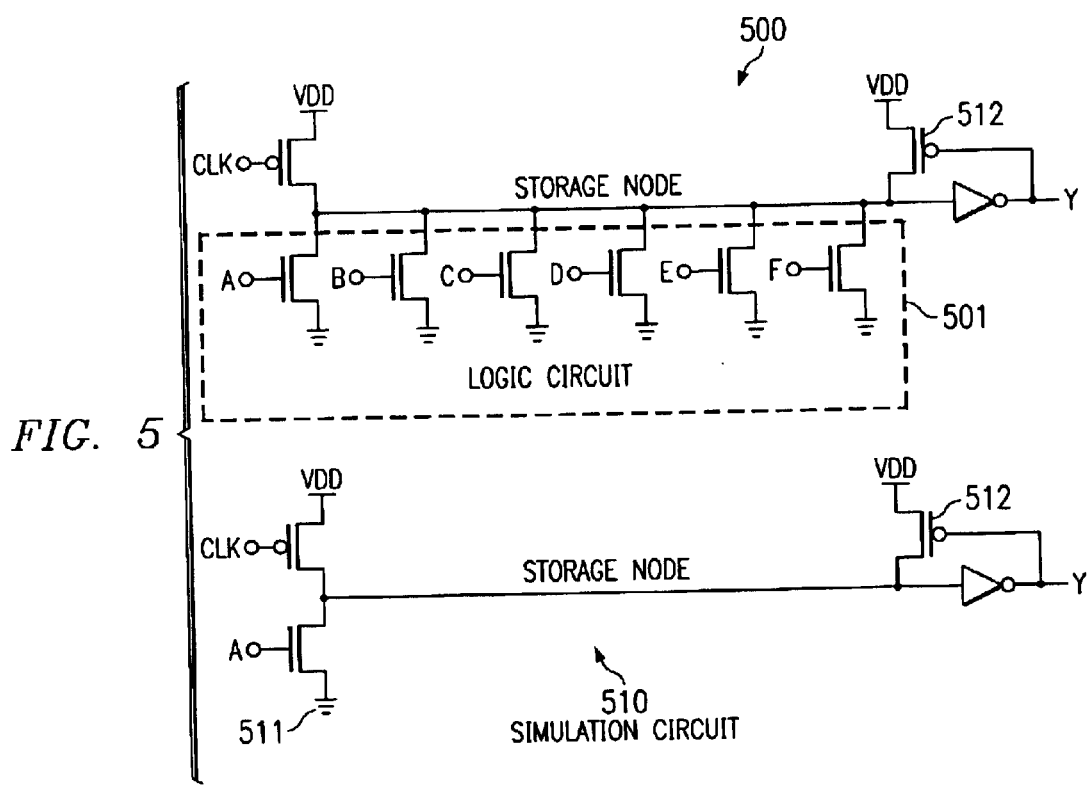
FIG. 5 is a circuit schematic illustrating a wide gate width OR circuit and one possible corresponding model circuit generated according to one embodiment of the present invention.

FIG. 5 is a circuit schematic illustrating a wide gate width OR circuit and one possible corresponding model circuit generated according to one embodiment of the present invention. Wide OR circuit 500 may be represented by OR circuit 510. The widths of pull-down FETs 501 gates may preferably be summed together and simulated with single pull-down FET 511 having a gate width equal to that sum. The user would preferably need only to sum the widths of pull-down FETs 501 and then consult generated design guideline tables to determine what size holder FET 512 should be. It should be noted that the design guideline tables may be generated using technology described in the co-pending, commonly assigned patent application entitled, "PROCESS AND SYSTEM FOR DEVELOPING DYNAMIC CIRCUIT GUIDELINES," Ser. No. 10/282,478.

FIG. 6 is a circuit schematic illustrating a wide gate width OR circuit with a DNG FET and one possible corresponding model circuit generated according to one embodiment of the present invention. Wide OR circuit 600 with DNG FET 602 may be reduced and modeled by DNG-OR circuit 610. Similar to the example illustrated in FIG. 5, the widths of pull-down FETs 601 may preferably be summed and the size of corresponding holder FET 612 may preferably be obtained from a table.

FIG. 7 is a circuit schematic illustrating wide gate width AND/OR circuit 700 and one possible corresponding model circuit 710 generated according to one embodiment of the present invention. Just as in FIGS. 5 and 6, the widths of pull-down FET(s) 701 are summed and the corresponding holder FET 712 value(s) are obtained from a table. Further shown in FIG. 7 is one example of corresponding model circuit 710 that includes DNG FET 713 with clock 721 in place of the inputs shown with wide gate width AND/OR circuit 700.

Figure 8:
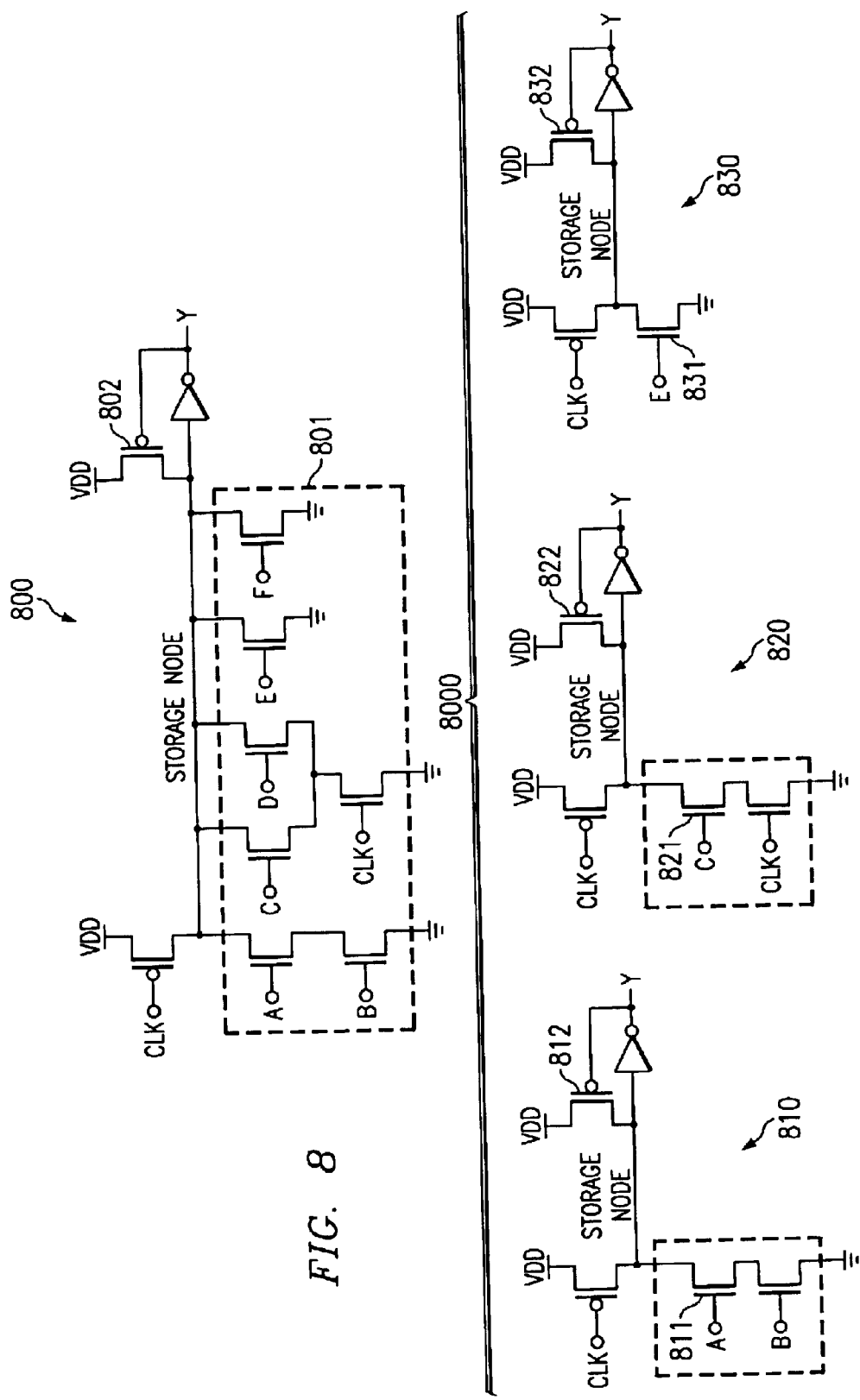
FIG. 8 is a schematic illustrating a complex dynamic circuit gate and one possible corresponding model circuit generated according to one embodiment of the present invention.

FIG. 8 is a schematic illustrating a complex dynamic circuit gate and one possible corresponding model circuit generated according to one embodiment of the present invention. With complex gate 800 and its corresponding simulation circuit 8000, the size of holder FET 802 is obtained by breaking complex gate 800 into each of model logic circuit subset elements 810, 820 and 830. For each model logic circuit 810, 820, and 830 the widths of pull-down FETs 811, 821, and 831 are added together and the size of corresponding holder FET 812, 822 and 832 are preferably obtained from a table.

Figure 9:
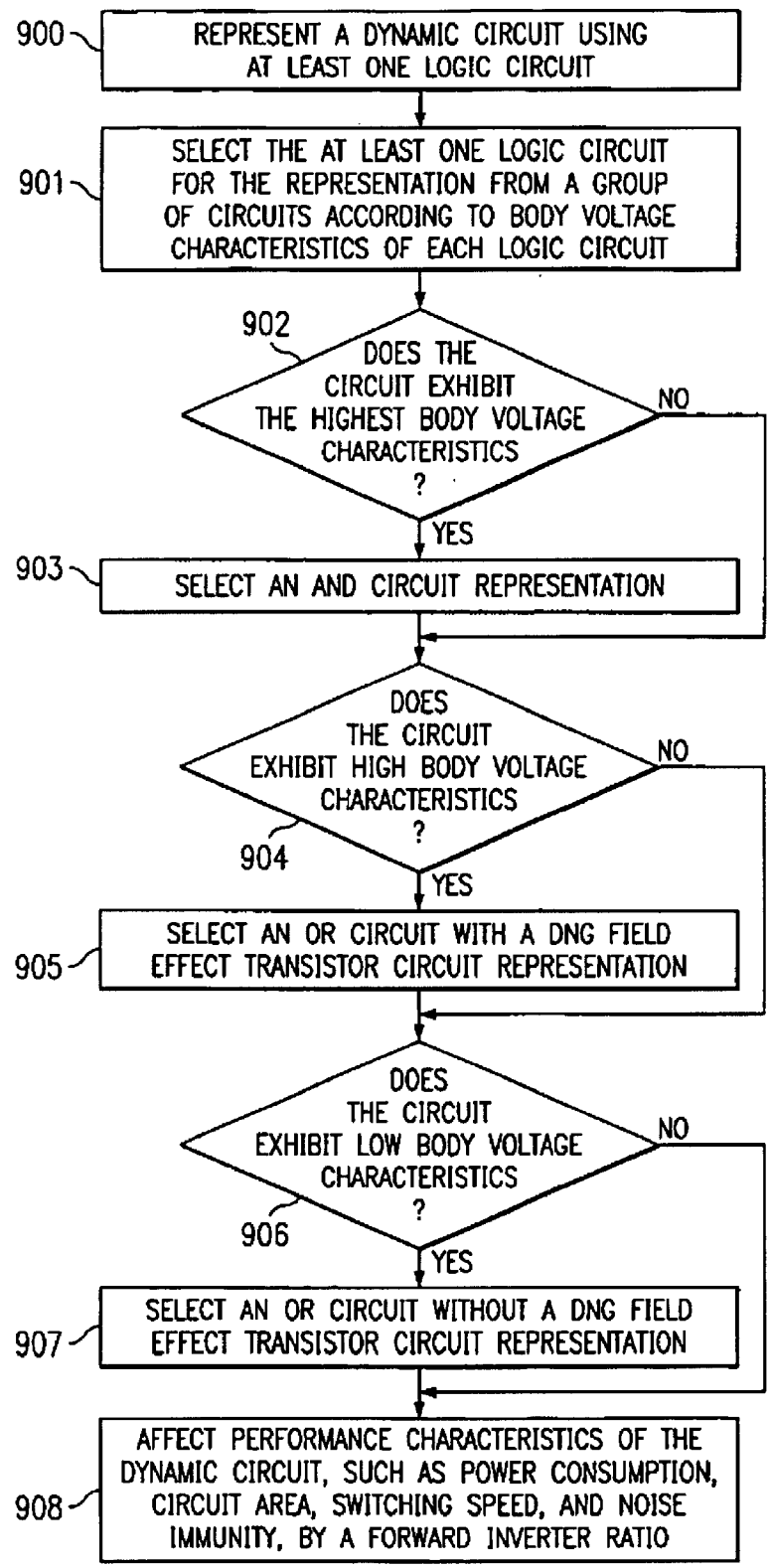
FIG. 9 is a flowchart illustrating example steps for designing a dynamic circuit in a SOI process executed in implementing one embodiment of the present invention.

FIG. 9 is a flowchart illustrating example steps for designing a dynamic circuit in a SOI process executed in implementing one embodiment of the present invention. In step 900, a dynamic circuit is represented using at least one logic circuit. This representative logic circuit is selected, in step 901, from a group of circuits according to the body voltage characteristics of each logic circuit. A determination is made, in step 902, whether the circuit exhibits the highest body voltage characteristics. If so, an AND circuit representation is selected in step 903. If not, the process continues. In step 904, a determination is made whether the circuit exhibits high body voltage characteristics. If so, an OR circuit with a DNG FET circuit representation is selected in step 905. Otherwise, the process continues. In step 906, a determination is made whether the circuit exhibits low body voltage characteristics. If so, an OR circuit without a DNG FET circuit representation is selected in step 907. If not then performance characteristics of the dynamic circuit, such as power consumption, circuit area, switching speed, and noise immunity, are affected by a forward inverter ratio in step 908.

Figure 10:
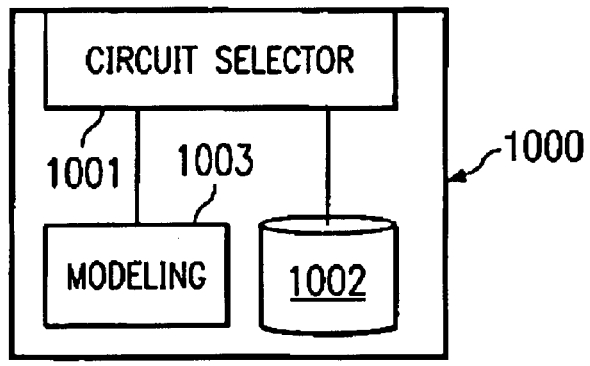
FIG. 10 is a block diagram illustrating one embodiment of the present invention.

FIG. 10 is a block diagram illustrating one embodiment of the present invention. Modeling system 1000 includes circuit selector 1001 and circuit model group 1002. One or more circuit models are selected from circuit model group 1002 according to performance criteria of the circuits. Performance criteria may include characteristics such as body voltage. When selected, the SOI dynamic circuit is then modeled by modeling block 1003.

Figure 11:
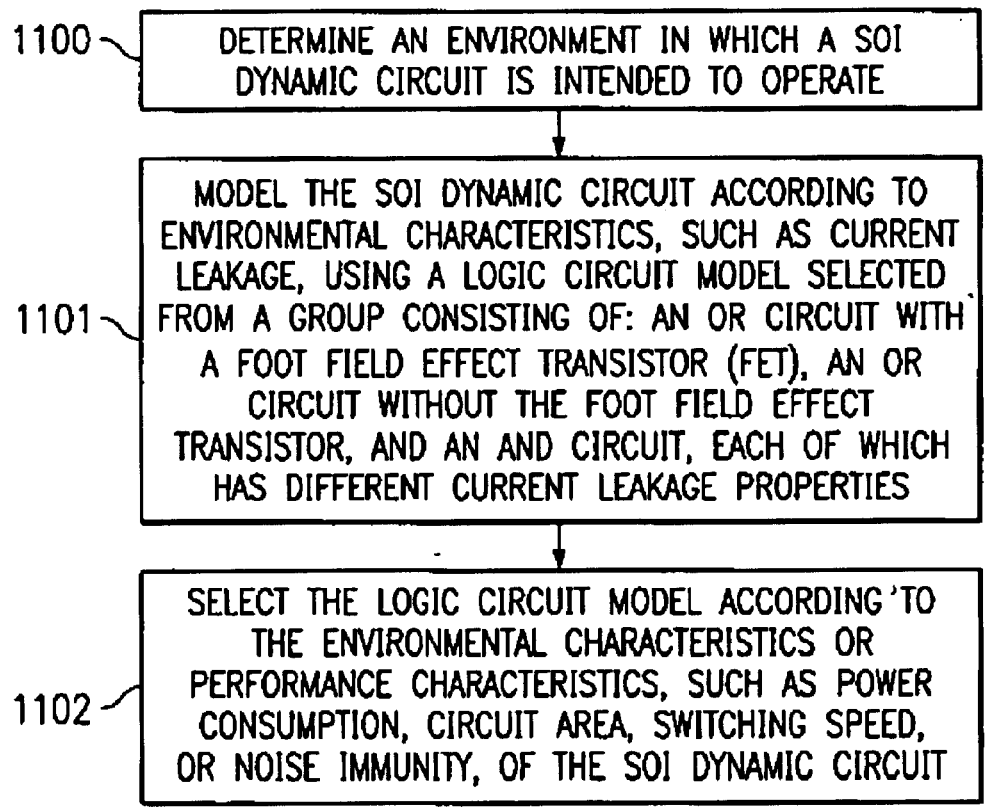
FIG. 11 is a flowchart illustrating example steps for optimizing the design of a SOI dynamic circuit executed in implementing another embodiment of the present invention.

FIG. 11 is a flowchart illustrating example steps for optimizing the design of a SOI dynamic circuit executed in implementing another embodiment of the present invention. In step 1100, an environment in which a SOI dynamic circuit is intended to operate is determined. The SOI dynamic circuit is modeled, in step 1101, according to environmental characteristics, such as current leakage, using a logic circuit model selected from a group consisting of an OR circuit with a foot field effect transistor (FET), an OR circuit without said foot FET, and an AND circuit, each of which has different current leakage properties. In step 1102, the logic circuit model is selected according to the environmental characteristics or performance characteristics, such as power consumption, circuit area, switching speed, or noise immunity, of the SOI dynamic circuit.

The described embodiments of the present invention allow dynamic circuit designers to optimize the design of any dynamic circuit fabricated in SOI material. Therefore, instead of using only a single-circuit model, which would sacrifice performance characteristics for simplicity, or hand-designing each circuit, which is extremely costly, designers may preferably create and simulate circuit designs that balance the amount of expected leakage, and therefore, noise immunity, against the desired performance characteristics. Each of the three different model circuit types preferably reflect different amounts of body voltage, which effects the expected leakage and noise immunity, therefore, the best performance may be designed for the simplicity that could be achieved through the modeling process.

What is claimed is:

1. A method for designing a dynamic circuit in a silicon-on-insulator (SOI) process comprising the step of:
    representing said dynamic circuit using at least one logic circuit, wherein said at least one logic circuit is selected from a group consisting of:
        an OR circuit with a DNG field effect transistor (FET);
        an OR circuit without said DNG FET; and
        an AND circuit; and
    wherein said at least one logic circuit is selected according to body voltage characteristics of each circuit in said group.

2. The method of claim 1:
    wherein said AND circuit exhibits highest body voltage characteristics;
    wherein said OR circuit with a DNG FET exhibits high body voltage characteristics; and
    wherein said OR circuit without a DNG FET exhibits low body voltage characteristics.

3. The method of claim 1 wherein said at least one logic circuit is comprised of:
    a clock-driven pre-charge FET, a source terminal of which is connected to a storage node;
    an inverter, connected to said storage node said inverter having a feedback loop connected to a holder FET;
    a voltage source, connected to drain terminals of each of said pre-charge FET and said holder FET; and
    one or more pull-down FETs, wherein a drain terminal of a first one of said one or more pull-down is connected to said source terminals of said clock-driven pre-charge FET and to a source terminal of said holder FET.

4. The method of claim 3 wherein a forward inverter ratio of said at least one logic circuit affects performance characteristics of said dynamic circuit.

5. The method of claim 4 wherein said performance characteristics include one or more of:
    power consumption of said dynamic circuit;
    circuit area of said dynamic circuit;
    a switching speed of said dynamic circuit; and
    a noise immunity of said dynamic circuit.

6. A system for modeling a silicon-on-insulator (SOI) dynamic circuit comprising:
    a circuit model for representing said SOI dynamic circuit, wherein said circuit model is selected from a group consisting of:
        an OR circuit with a clock field effect transistor (FET);
        an OR circuit without said clock FET; and
        an AND circuit; and
    wherein said selection of said circuit model is made according to performance characteristics of each circuit in said group.

7. The system of claim 6 wherein said performance characteristics includes at least a body voltage characteristic.

8. The system of claim 7:
    wherein said AND circuit exhibits highest body voltage characteristics;
    wherein said OR circuit with a clock FET exhibits high body voltage characteristics; and
    wherein said OR circuit without a clock FET exhibits low body voltage characteristics.

9. A method for optimizing design of a silicon-on-insulator (SOI) dynamic circuit comprising the steps of:
    determining an environment in which said SOI dynamic circuit is intended to operate;
    modeling said SOI dynamic circuit according to environmental characteristics using a logic circuit model selected from a group consisting of:
        an OR circuit with a foot field effect transistor (FET);
        an OR circuit without said foot FET; and
        an AND circuit; and wherein said logic circuit model is selected according to at least one of:
        said environmental characteristics; and
        performance characteristics of said SOI dynamic circuit.

10. The method of claim 9 wherein said environmental characteristics include at least an amount of current leakage.

11. The method of claim 10 wherein each logic circuit model in said group exhibits different current leakage properties.

12. The method of claim 9 wherein said performance characteristics includes at least one or more of:
    power consumption;
    circuit area;
    a switching speed; and
    a noise immunity.

* * * * *

UNITED STATES PATENT AND TRADEMARK OFFICE
CERTIFICATE OF CORRECTION

PATENT NO. : 6,931,607 B2 Page 1 of 1
APPLICATION NO. : 10/282342
DATED : August 16, 2005
INVENTOR(S) : Jason R. Gunderson et al.

It is certified that error appears in the above-identified patent and that said Letters Patent is hereby corrected as shown below:

On the title page, item (54), in "Title", in column 1, line 1, after "DESIGNING" insert -- DYNAMIC --.

In column 1, line 1, after "DESIGNING" insert -- DYNAMIC --.

Signed and Sealed this

Second Day of February, 2010

David J. Kappos
*Director of the United States Patent and Trademark Office*